(12) United States Patent
Kurvathodil et al.

(10) Patent No.: US 11,579,280 B2
(45) Date of Patent: Feb. 14, 2023

(54) PHASE, PHASE NOISE, AND SLAVE MODE MEASUREMENT FOR MILLIMETER WAVE INTEGRATED CIRCUITS ON AUTOMATIC TEST EQUIPMENT

(71) Applicant: Infineon Technologies AG, Neubiberg (DE)

(72) Inventors: Manoj Kurvathodil, Linz (AT); Hao Li, Poing (DE)

(73) Assignee: Infineon Technologies AG, Neubiberg (DE)

( * ) Notice: Subject to any disclaimer, the term of this patent is extended or adjusted under 35 U.S.C. 154(b) by 502 days.

(21) Appl. No.: 16/711,928

(22) Filed: Dec. 12, 2019

(65) Prior Publication Data

US 2021/0181326 A1   Jun. 17, 2021

(51) Int. Cl.
| | |
|---|---|
| *G01S 13/02* | (2006.01) |
| *G01S 7/03* | (2006.01) |
| *G01S 7/40* | (2006.01) |
| *H01L 23/66* | (2006.01) |
| *G01S 19/23* | (2010.01) |

(52) U.S. Cl.
CPC .............. *G01S 13/02* (2013.01); *G01S 7/032* (2013.01); *G01S 7/4021* (2013.01); *G01S 19/23* (2013.01); *H01L 23/66* (2013.01); *H01L 2223/6683* (2013.01)

(58) Field of Classification Search
CPC ........ G01S 13/02; G01S 7/032; G01S 7/4021; G01S 7/356; G01S 7/4026; G01S 2013/0245; G01S 2013/0254; G01S 7/4008; G01S 7/4069; G01S 13/931; G01S 13/42; G01S 13/58; H01L 23/66; H01L 2223/6683; H04B 1/40
USPC ......................................................... 342/175
See application file for complete search history.

(56) References Cited

U.S. PATENT DOCUMENTS

| | | | |
|---|---|---|---|
| 2004/0012517 A1* | 1/2004 | Abou-Jaoude | ........ G01S 7/4052 342/171 |
| 2015/0009064 A1* | 1/2015 | Waldschmidt | ........... H04B 1/30 342/175 |
| 2016/0077196 A1* | 3/2016 | Dehlink | ............. G01R 31/2822 342/169 |
| 2016/0187464 A1* | 6/2016 | Ginsburg | .............. G01S 7/4008 342/168 |

(Continued)

*Primary Examiner* — Vladimir Magloire
*Assistant Examiner* — Alexander L. Syrkin
(74) *Attorney, Agent, or Firm* — Harrity & Harrity, LLP

(57) ABSTRACT

A radar monolithic microwave integrated circuit (MMIC) includes a first transmission channel configured to output a first continuous-wave transmit signal based on a local oscillator signal having a first frequency; a first phase shifter provided on the first transmission channel and configured to apply a first phase setting to the first continuous-wave transmit signal to generate a first transmit signal having the first frequency; a first transmit monitoring signal path configured to couple out a portion of the first transmit signal from the first transmission channel as a first transmit monitoring signal; a frequency multiplier configured to receive a test signal and convert it into a multiplied test signal having a second frequency, where the first and the second frequencies are separated by a frequency offset; and a down-conversion mixer configured to mix the multiplied test signal and the first transmit monitoring signal to generate a first mixer output signal.

21 Claims, 3 Drawing Sheets

(56) References Cited

U.S. PATENT DOCUMENTS

2017/0090015 A1* 3/2017 Breen .................... G01S 13/87
2019/0146059 A1* 5/2019 Zanati .................... H01Q 3/38
                                                        342/173

* cited by examiner

PHASE, PHASE NOISE, AND SLAVE MODE MEASUREMENT FOR MILLIMETER WAVE INTEGRATED CIRCUITS ON AUTOMATIC TEST EQUIPMENT

FIELD

The present disclosure relates to the field of radio frequency (RF) circuits, and particularly to a multi-channel RF circuits with multiple RF output channels.

BACKGROUND

Modern radar devices such as radar range and velocity sensors can be integrated in so-called monolithic microwave integrated circuits (MMICs). Radar sensors may be applied, for example, in the automotive sector, where they are used in so-called advanced driver assistance systems (ADAS) such as, for example, "adaptive cruise control" (ACC) or "radar cruise control" systems. Such systems may be used to automatically adjust the speed of an automobile so as to maintain a safe distance from other automobiles travelling ahead. However, RF circuits are also used in many other fields such as RF communication systems.

A radar MMIC (sometimes referred to as single chip radar) may incorporate all core functions of the RF frontend of a radar transceiver (e.g., local oscillator, power amplifiers, low-noise amplifiers (LNA), mixers, etc.), the analog pre-processing of the intermediate frequency (IF) or base band signals (e.g., filters, amplifiers, etc.), and the analog-to-digital conversion in one single package. The RF frontend usually includes multiple reception and transmission channels, particularly in applications in which beam steering techniques, phased antenna arrays, etc. are used. In radar applications, phased antenna arrays may be employed to sense the incidence angle of incoming RF radar signals, also referred to as Direction of Arrival (DOA).

When using a phased antenna array to radiate a radar signal, the phase and/or amplitude of each output channel needs to be known. Signal phase parameters, such as phase resolution and phase balance, and phase noise are crucial parameters defined for a radar transmitter that needs to be functionally tested in production tests using Automated Test Equipment (ATE). However, current ATE measurement methods have long tests times which leads to higher costs. Furthermore, the performance measurement of a transmission channel while used in a slave mode in a cascaded system is not possible.

Direct measurement of these parameters at a transmitter output is unviable due to challenges associated with handling of millimeter (mm) wave (mm-wave) signals at the test hardware level such as signal transition from tester interface board to device under test (DUT). Moreover, even state of the art ATE features calibrated microwave sources and receivers only up to X band (8 GHz-12 GHz).

Due to above mentioned limitations, the production test employs measurement strategies which are test time intensive, leading to higher test costs.

SUMMARY

Embodiments provide a method for and a device for transmission phase measurements and calibration.

One or more embodiments provide a radio frequency (RF) system that includes a radar monolithic microwave integrated circuit (MMIC). The radar MMIC includes a first transmission channel configured to output a first continuous-wave transmit signal based on a local oscillator signal having a first frequency; a first phase shifter provided on the first transmission channel and configured to apply a first phase setting to the first continuous-wave transmit signal to generate a first transmit signal having the first frequency; a first transmit monitoring signal path configured to couple out a portion of the first transmit signal from the first transmission channel as a first transmit monitoring signal; a test input port configured to receive a test signal from a source external to the radar MMIC; a frequency multiplier configured to receive the test signal and convert the test signal into a multiplied test signal having a second frequency, wherein the first and the second frequencies are separated by a frequency offset; and a down-conversion mixer configured to mix the multiplied test signal and the first transmit monitoring signal to generate a first mixer output signal. In embodiments described herein, the continuous-wave signal applied for testing or calibration contains a single frequency, i.e. is a single-tone signal.

One or more embodiments provide a method of measuring transmission phase information. The method includes generating a first continuous-wave transmit signal based on a local oscillator signal having a first frequency, the first continuous-wave transmit signal being transmitted on a first transmission channel; applying a first phase setting to the first continuous-wave transmit signal to generate a first transmit signal; coupling out a portion of the first transmit signal from the first transmission channel as a first transmit monitoring signal; receiving a test signal from an external source; frequency multiplying the test signal into a multiplied test signal having a second frequency, wherein the first and the second frequencies are separated by a frequency offset; and mixing the multiplied test signal and the first transmit monitoring signal to generate a first mixer output signal.

One or more embodiments provide a radar MMIC configurable into a plurality of modes, including a slave mode and a test mode. The radar MMIC includes an input port configured to receive a slave reference signal from a local oscillator of another radar MMIC; a first transmission channel configurable in a slave mode to output a first transmit signal within an operating frequency range based on the slave reference signal; a transmission path having an injection point coupled to a plurality of transmit channels, including the first transmission channel, the injection point receiving a second transmit signal that is based on the slave reference signal, wherein the transmission path extends from the input port to the injection point; a test input port configured to receive a test signal from a source external to the radar MMIC; a frequency multiplier configured to receive the test signal and convert the test signal into a multiplied test signal; and a coupler configured to receive the multiplied test signal and couple the multiplied test signal into the transmission path.

BRIEF DESCRIPTION OF THE DRAWINGS

Embodiments are described herein making reference to the appended drawings.

DETAILED DESCRIPTION

Figure 1:
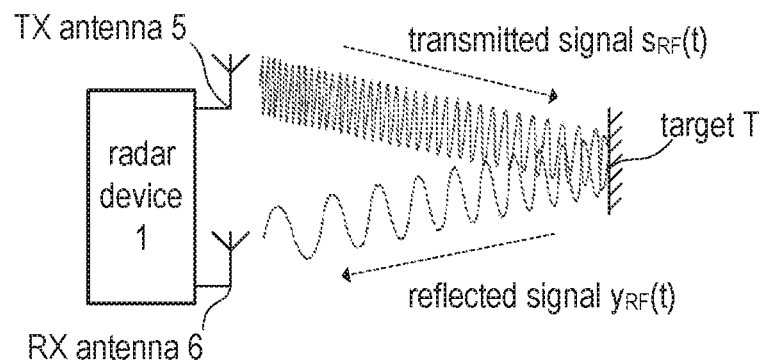
FIG. 1 is a drawing illustrating the operating principle of a continuous-wave (CW) radar system for distance and/or velocity measurement.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and/or any other processes required to make a sensor output suitable for processing after conditioning.

Thus, a signal processing circuit may include analog circuitry and/or digital circuitry including an analog-to-digital converter (ADC) that converts the analog signal from the one or more sensor elements to a digital signal. The signal processing circuit may include a digital signal processor (DSP) or a control unit that performs some processing on the digital signal.

Embodiments are discussed below in the context of a radar transmitter or transceiver. It should be noted, however, that the present invention may also be applied in applications different from radar such as, for example, RF transceivers of RF communication devices. In fact, almost any RF circuitry with one or multiple RF channels may take advantage of the concepts described herein.

One or more embodiments is directed to test time reduction of a functional test for phase resolution of a transmission (TX) sub-system on Automated Test Equipment (ATE) using native instrumentations. The proposed approach provides an alternative to measuring the phase and phase noise parameters of a transmission signal using native instrumentations of ATE, and which has a reduction in ATE test time and increased coverage in production testing.

One or more embodiments improve the test capability and stability of phase noise of a transmission (TX) signal at 1 MHz and enable 10 MHz offset frequency measurements to increase test coverage.

One or more embodiments provide a method to enable functional test for slave mode operation for cascaded system applications which would increase the test coverage of slave mode production tests.

FIG. 1 illustrates a continuous-wave (CW) or frequency-modulated CW (FMCW) radar system 1. In the present example, separate transmission (TX) and reception (RX) antennas 5 and 6, respectively, are used. However, it is noted that a single antenna can be used so that the transmission antenna and the reception antenna are physically the same (monostatic radar configuration). The transmission antenna continuously radiates an RF signal $s_{RF}(t)$. The transmitted signal $s_{RF}(t)$ is back-scattered at a target T, which is located in the radar channel within the measurement range of the radar device. The back-scattered signal $y_{RF}(t)$ is received by the reception antenna 6. In the depicted example, the back-scattered signal is denoted as $y_{RF}(t)$.

Figure 2:
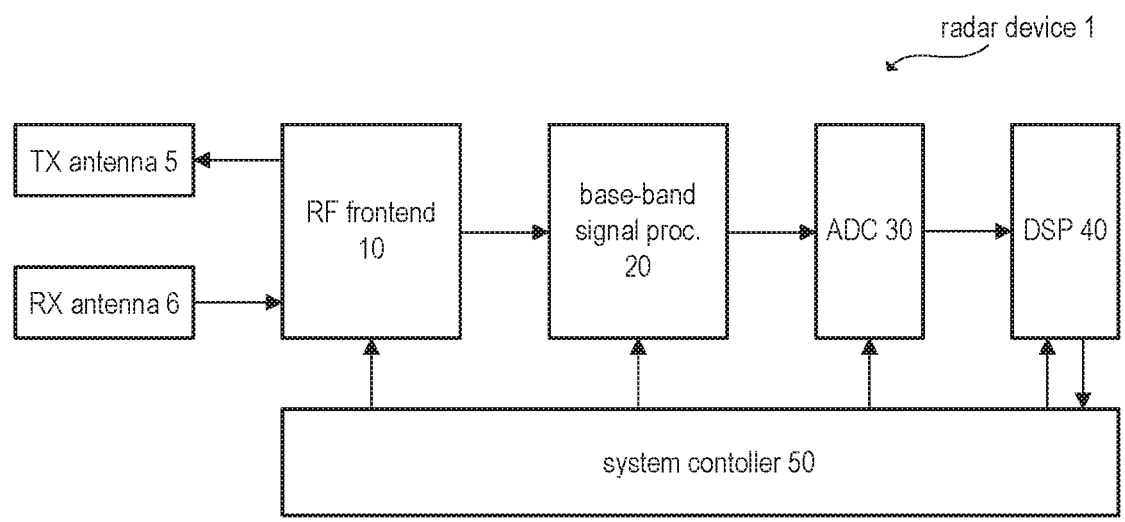
FIG. 2 is a block diagram illustrating the basic structure of a CW radar device.

FIG. 2 is a block diagram that illustrates an exemplary structure of a radar device 1 (radar sensor). It is noted that a similar structure may also be found in RF transceivers used in other applications such as, for example, in wireless communications systems. Accordingly, at least one transmission antenna 5 (TX antenna) and at least one reception antenna 6 (RX antenna) are connected to an RF frontend 10, which may be integrated in a monolithic microwave integrated circuit (MMIC). The RF frontend 10 may include all the circuit components needed for RF signal processing. Such circuit components may (but need not necessarily) include, for example, a local oscillator (LO), RF power amplifiers, low noise amplifiers (LNAs), directional couplers such as rat-race-couplers and circulators, and mixers for the down-conversion of RF signals (e.g., the received signal $y_{RF}(t)$, see FIG. 1) into the base-band or an intermediate frequency (IF) band. It is noted that antenna-arrays may be used instead of single antennas. The depicted example shows a bistatic (or pseudo-monostatic) radar system which has separate RX and TX antennas. In the case of a monostatic radar system, a single antenna or a single antenna array may be used to both receive and transmit electromagnetic (radar) signals. In this case, a directional coupler (e.g., a circulator) may be used to separate RF signals to be transmitted to the radar channel from RF signals received from the radar channel. In practice, radar systems often include several transmission (TX) and reception (RX) channels, which among others allows the measurement of the direction (direction of arrival (DoA)), from which the radar echoes are received.

In the case of a continuous-wave (CW) or FMCW radar system, the transmitted RF signals radiated by the TX antenna 5 are in the range between approximately 20 GHz and 100 GHz (e.g. in the frequency band 21 to 26 GHz or in the frequency band 76 to 81 GHz). As mentioned, the RF signal $y_{RF}(t)$ received by the RX antenna 6 includes the radar echoes, i.e., the signal back-scattered at the so-called radar targets. The received RF signals $y_{RF}(t)$ are down-converted into the base band (or IF band) and further processed in the base band using analog signal processing (see FIG. 2, base-band signal processing chain 20), which basically includes filtering and amplification of the base-band signal. The base-band signal is finally digitized using one or more analog-to-digital converters (ADC) 30 and further processed in the digital domain (see FIG. 2, digital signal processing chain implemented, e.g., in digital signal processor, DSP, 40). The overall system is controlled by a system controller 50, which may be at least partly implemented using a processor, such as a microcontroller executing appropriate firmware. The RF frontend 10 and the analog base-band signal processing chain 20 (and optionally the ADC 30) may be integrated in a single MMIC. However, in some applications, some components may also be distributed among two or more integrated circuits.

Figure 3:
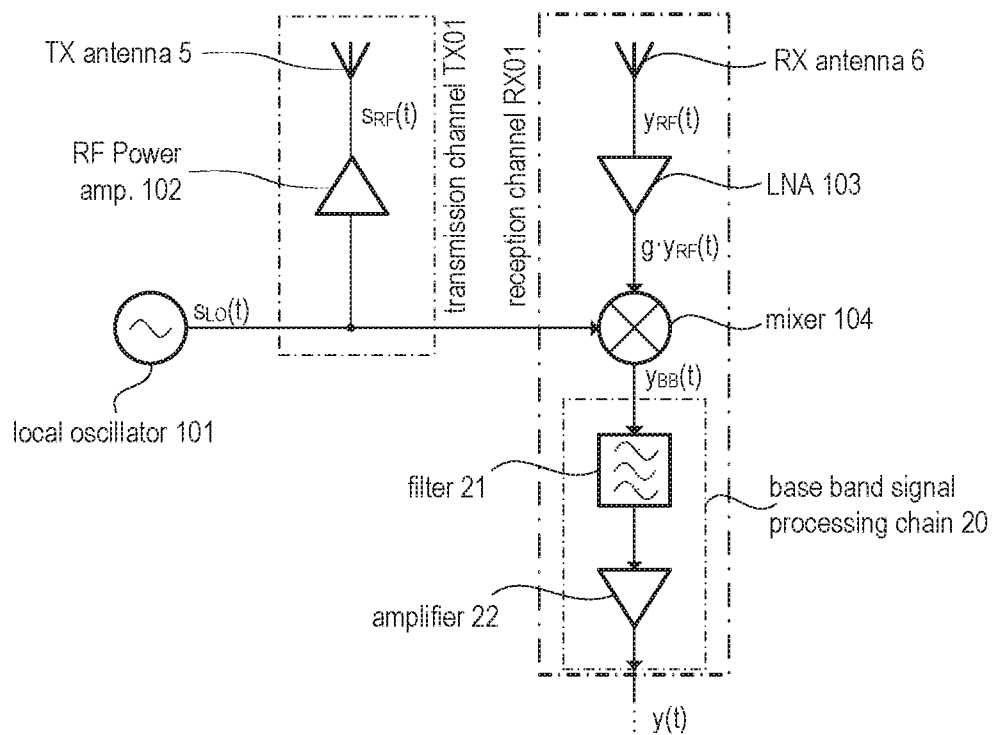
FIG. 3 is a circuit diagram illustrating one example of an analog RF frontend, which may be included in the CW radar device of FIG. 2.

FIG. 3 illustrated one exemplary implementation of the RF frontend 10, which may be included in the radar sensor shown in FIG. 2. It is noted that FIG. 3 is a simplified circuit diagram illustrating the basic structure of an RF frontend. Actual implementations, which may heavily depend on the application, are of course more complex and include several RX and/or TX channels. The RF frontend 10 includes a local oscillator (LO) 101 that generates a RF signal $s_{LO}(t)$. As will be described later on, in In the testing and/or calibration mode the LO 101 is controlled to generate a continuous wave signal set at a first fixed frequency within the operating range (e.g., within the frequency band 21 to 26 GHz or in the frequency band 76 to 81 GHz). During normal, in the field radar operation, the LO 101 is controlled to generate a frequency modulated signal (i.e., a FMCW signal) as the RF signal $s_{LO}(t)$, i.e., a signal with varying frequency. The signal $s_{LO}(t)$ is also referred to as LO signal. In radar applications, the LO signal is usually in the SHF (Super High Frequency) or the EHF (Extremely High Frequency) band, e.g., between 76 GHz and 81 GHz in automotive applications.

The LO signal $s_{LO}(t)$ is processed in the transmission signal path as well as in the reception signal path. The transmission signal $s_{RF}(t)$ (outgoing radar signal), which is radiated by the TX antenna 5, is generated by amplifying the LO signal $s_{LO}(t)$, e.g., using an RF power amplifier 102. The output of the amplifier 102 is coupled to the TX antenna 5. The received signal $y_{RF}(t)$ (incoming radar signal), which is provided by the RX antenna 6, is directed to a mixer 104. In the present example, the received signal $y_{RF}(t)$ (i.e., the antenna signal) is pre-amplified by RF amplifier 103 (gain g), so that the mixer receives the amplified signal $g\,y_{RF}(t)$ at its RF input port. The mixer 104 further receives the LO signal $s_{LO}(t)$ at its reference input port and is configured to down-convert the amplified signal $g\,y_{RF}(t)$ into the base band. The resulting base-band signal at the mixer output is denoted as $y_{BB}(t)$. The base-band signal $y_{BB}(t)$ is further processed by the analog base band signal processing chain 20 (see also FIG. 2), which basically includes one or more filters (e.g., a band-pass 21) to remove undesired side bands and image frequencies as well as one or more amplifiers such as amplifier 22). The analog output signal, which may be supplied to an analog-to-digital converter (cf. FIG. 2), is denoted as y(t). Various techniques for the digital post-processing of the digitized output signals (digital radar signal) are as such known (e.g., Range Doppler Analysis) and thus not further explained herein.

In the present example, the mixer 104 down-converts the RF signal $gy_{RF}(t)$ (amplified antenna signal) into the base band. The respective base band signal (mixer output signal) is denoted by $y_{BB}(t)$. The down-conversion may be accomplished in a single stage (i.e., from the RF band into the base band) or via one or more intermediate stages (from the RF band into an IF band and subsequently into the base band). In view of the example of FIG. 3, it is clear that the quality of the radar measurement will heavily depend on the quality of the LO signal $s_{LO}(t)$. Low phase noise, as well as steep and highly linear frequency ramps are desired properties of the LO signal $s_{LO}(t)$.

Figure 4:
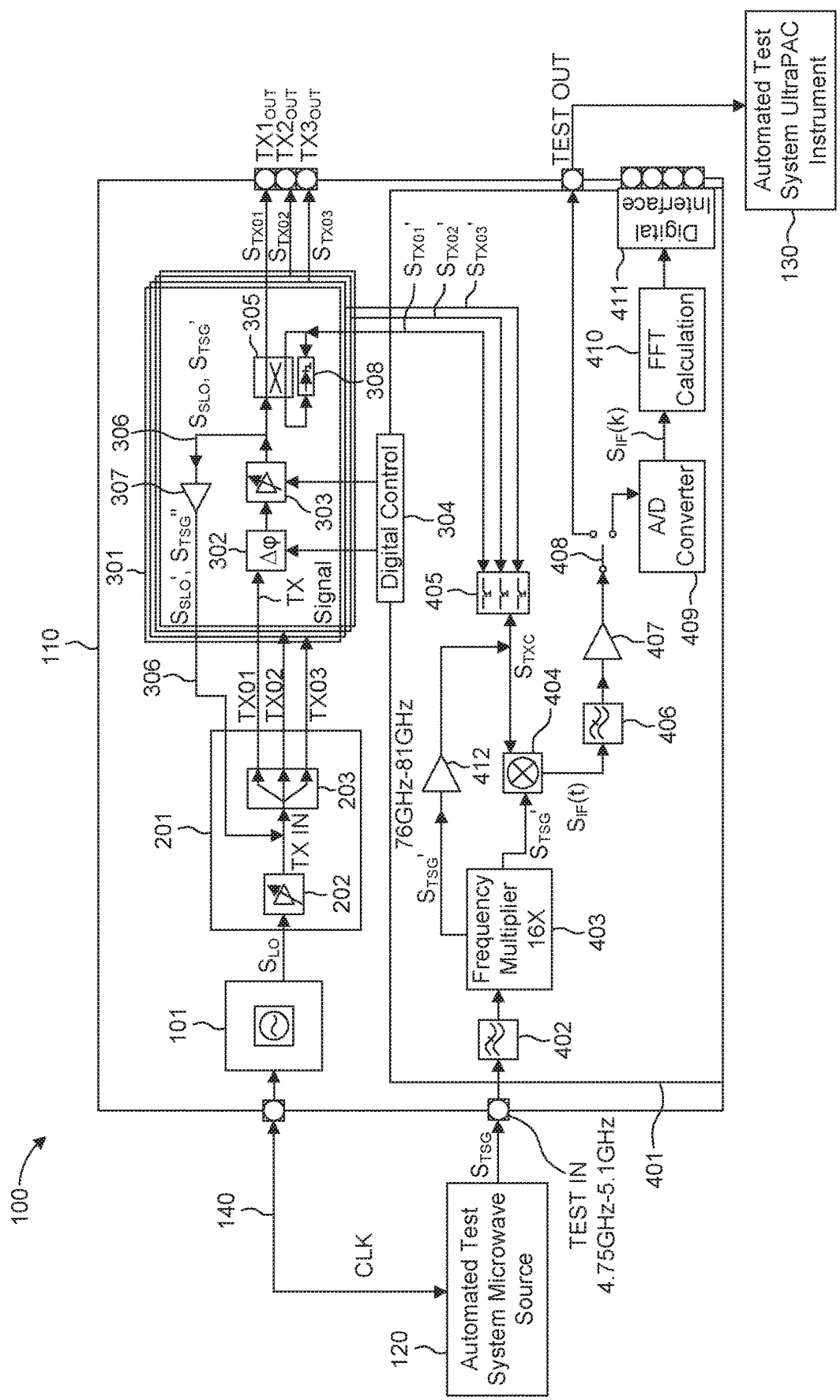
FIG. 4 is a block diagram illustrating one example of an RF circuit with multiple RF channels for generating multiple RF output signals according to one or more embodiments.

FIG. 4 is a block diagram illustrating one example of an RF circuit 100 for testing an MMIC 110 having multiple RF channels for generating multiple RF output signals. In particular, the RF circuit 100 includes the MMIC 110, an automated test system microwave source 120, and, optionally, an automated test system evaluation device 130. The automated test system microwave source 120 and the automated test system evaluation device 130 may also be part of an automated test equipment (ATE), and may thus be referred to as ATE 120 and ATE 130, respectively.

The MMIC 110 is regarded as a device under test (DUT). The automated test system microwave source 120 is a signal generator that is configured to generate test stimuli (i.e., test signals) applied from the ATE. The automated test system evaluation device 130 may optionally receive a mixer output signal $S_{IF}(t)$ for phase and amplitude evaluation. Alternatively, the phase and amplitude evaluation may be performed on the MMIC 110.

In the present example, three transmission channels TX01, TX02, and TX03 of a radar sensor are considered as one illustrative application. The concept can be generalized to a system with c channels, where c is any integer. However, for a better understanding, one exemplary embodiment with three channels TX01, TX02, and TX03 will be described.

In the present example, each channel TX01-TX03 is configured to receive, at its input, an RF oscillator signal $s_{LO}(t)$, which may be provided from a local oscillator 101.

The MMIC 110 includes a local oscillator 101 coupled to an RF signal distribution circuit 201. The local oscillator 101 includes, for example, a voltage-controlled oscillator (VCO) arranged in a phased-locked loop (PLL), and is configured to generate the RF oscillator signal $s_{LO}(t)$. In this example, for testing and calibration, the local oscillator 101 generates the RF oscillator signal $s_{LO}(t)$ having a first fixed frequency in a frequency band between 76 GHz and 81 GHz. However, other frequencies and frequency bands are possible and the first fixed frequency is not limited to a particular frequency or frequency band. The RF oscillator signal $s_{LO}(t)$ may also be referred to as a reference signal and is configured as a continuous-wave signal. The LO signal $s_{LO}(t)$ is processed in the transmission signal path of one or more TX channels to generate a continuous-wave transmission signal that is radiated by the TX antenna 5.

The RF signal distribution circuit 201 includes an RF power amplifier 202 and a signal distributor 203 (e.g., a distribution multiplexer or a splitter). The signal distributor 203 is arranged at an end of a shared transmission channel or shared transmission path that is common to the transmission channels TX01-TX03. The input of the signal distributor 203 represents a transmission input TX IN of the transmission channels TX01-TX03. At the signal distributor 203, the shared transmission channel is split into the separate transmission channels TX01-TX03 by the signal distributor 203. The signal distributor 203 is configured to receive the amplified RF oscillator signal $s_{LO}(t)$ and distribute the RF oscillator signal $s_{LO}(t)$ to the inputs of the transmission channels TX01-TX03.

The RF circuit 100 includes a transmission (TX) subsystem 301 that includes multiple RF transmission channels and represents a device under test (DUT). As noted above, three transmission channels TX01, TX02, and TX03 are provided in the present example. The three transmission channels TX01, TX02, and TX03 receive RF signals from the signal distributor 203. For example, the three transmission channels TX01, TX02, and TX03 may receive the RF oscillator signal $s_{LO}(t)$ or another signal coupled to the input of the signal distributor 203 via a transmission path, e.g., transmission path 306.

Each channel TX01-TX03 may include a phase shifter 302 for applying different phase settings to the channels. For example, each phase shifter 302 may manipulate the overall phase lags caused by channels. The RF output signals of the channels TX01-TX03 are denoted as $s_{TX01}(t)$, $s_{TX02}(t)$, and $s_{TX03}(t)$, respectively. In each channel TX01, TX02, and TX03 the signal path from the input to the output includes signal lines and one or more circuit components that may cause a phase lag. As a consequence, the output signals can be written as follows:

$$s_{TX01}(t) = A_{TX01} \cdot \cos(2\pi f_{LO}t + \varphi_{TX01} + \Delta\varphi_{TX01}) \quad (1)$$

$$s_{TX02}(t) = A_{TX02} \cdot \cos(2\pi f_{LO}t + \varphi_{TX02} + \Delta\varphi_{TX02}) \quad (2)$$

$$s_{TX03}(t) = A_{TX03} \cdot \cos(2\pi f_{LO}t + \varphi_{TX03} + \Delta\varphi_{TX03}) \quad (3)$$

Thereby, the variables $A_{TX01}$, $A_{TX02}$, and $A_{TX03}$ denote the amplitudes of the RF output signals $s_{TX01}(t)$, $s_{TX02}(t)$, and $s_{TX03}(t)$, and the frequency $f_{Lo}$ is the frequency of the RF oscillator signal $s_{LO}(t)$. The phases $\varphi_{TX01}$, $\varphi_{TX02}$, and $\varphi_{TX03}$ represent the phase lag caused by the channels TX01-TX03, respectively, without considering phase shifters 302, whereas $\Delta\varphi_{TX01}$, $\Delta\varphi_{TX02}$, and $\Delta\varphi_{TX03}$ denote the additional the phase shifts caused by the phase shifters 302. As used herein, $\Delta\varphi_{Txc}$ is the phase shift caused by a phase shifter 302 on RF channel TXc and $\varphi_{Txc}$ is the phase shift caused by further circuit components in the signal path from the local oscillator 101 to the output of the RF channel TXc. $A_{Txc}$ denotes the amplitude of the output signal $s_{Txc}(t)$.

At this point it is noted that the phases as well as the amplitudes heavily depend on the operating conditions of the system. For example, depending on which of the TX channels is active, the temperature of the chip (e.g., the MMIC) will vary due to the power losses caused in the active channel(s). When two or more TX channels are active (i.e., outputting an RF signal) the temperature will be different as compared to the case, in which only one TX channel is active. Amplitudes and phases of the RF output signals $s_{TX01}(t)$, $s_{TX02}(t)$, and $s_{TX03}(t)$ are temperature dependent. For example, in beam forming applications (in which the results of amplitude and phase measurement are applied) channels TX01 and TX02 may be active (transmitting), which causes the temperature to rise to a specific value and thus particular amplitude and phase values. Amplitude and values shifts measured in a configuration, in which only one of the channels (TX01, TX02, or TX03) is active, would be different and thus incorrect (as the configuration which only one active channel does not resemble the beamforming application. Accordingly, it may be important to allow measurement of amplitude and phase values while both of the channels are active.

As mentioned, each channel TX01-TX03 includes a phase shifter 302, which is configured to generate additional phase shift values $\Delta\varphi_{TX01}$, $\Delta\varphi_{TX02}$, and $\Delta\varphi_{TX03}$ (phase lags), which contribute to the phases of the RF output signals $s_{TX01}(t)$, $s_{TX02}(t)$, and $s_{TX03}(t)$. Furthermore, each channel TX01-TX03 may include an RF amplifier 303 (e.g., a power amplifier (PA), which is similarly represented by amplifier 102 in FIG. 3. In this case, the amplitudes $A_{TX01}$, $A_{TX02}$, and $A_{TX03}$ of the RF output signals $s_{TX01}(t)$, $s_{TX02}(t)$, and $s_{TX03}(t)$ depend on the gains of the RF amplifiers 303. In accordance with one specific example, the phase shifters 302 may be implemented using IQ modulators (In-Phase/Quadrature modulators, also referred to as Quadrature modulators). Digital-to-analog converters (not shown) may be used to convert digital values representing the phase shift values $\Delta\varphi_{TX01}$, $\Delta\varphi_{TX02}$, and $\Delta\varphi_{TX03}$ into analog signals that control (or adjust) the IQ modulators (phase shifters 302).

In some applications (e.g., for the system controller 50 or a radar sensor, see FIG. 2) it may be desirable to know the phases of the RF output signals of the different channels, e.g., relative to each other or relative to a reference phase. For example, the channels TX01-TX03 may be transmission channels of a radar sensor device and the phases of the RF output signals will be tuned to specific values to realize the digital beamforming. As the absolute phase lags caused by the circuit components (e.g., the amplifiers 303) included in the channels TX01-TX03 may be temperature dependent and may also be subject to production tolerances and aging, the respective phases $\varphi_{TX01}$, $\varphi_{TX02}$, and $\varphi_{TX03}$ need to be tuned or monitored, which may be accomplished by the phase shifters 302 included in the channels TX01-TX03.

In order to be able to monitor the phases $\varphi_{TX01}$, $\varphi_{TX02}$, and $\varphi_{TX03}$ of the RF output signals $s_{TX01}(t)$, $s_{TX02}(t)$, and $s_{TX03}(t)$, a monitor circuit 401 (including, e.g., frequency multiplier 403 and phase mixer 404) is provided that is used to sense the total TX channel phases $\varphi_{TX01}$, $\varphi_{TX02}$, and $\varphi_{TX03}$ and thus to detect a possible maladjustment of the phases. In the event that the measured phases $\varphi_{TX01}$, $\varphi_{TX02}$, and $\varphi_{TX03}$ deviates from a desired setting, compensated phase information $\alpha_{Tx}$ may be generated and provided to the phase shifters 302 via digital controller 304 in order to compensate for the deviation by adding additional phase shifts $\Delta\varphi_{TX01}$, $\Delta\varphi_{TX02}$, and $\Delta\varphi_{TX03}$.

Each transmission channel TX01-TX03 may also include a transmission coupler 305 configured to couple out a portion of a respective output signal $s_{TX01}(t)$, $s_{TX02}(t)$, and $s_{TX03}(t)$ as a transmission monitoring signal. Thus, before output ports TX1out-TX3out, a portion of the continuous-wave transmission signal is coupled out by coupler 305 as a continuous-wave transmission monitoring signal $s_{TX01}'(t)$, $s_{TX02}'(t)$, $s_{TX03}'(t)$, ..., $s_{TXc}'(t)$).

Each transmission channel TX01-TX03 may also include a peak-peak detector circuit 308 configured to receive a respective transmission monitoring signal and measure a transmission output power of a transmission channel based on the respective transmission monitoring signal. An automated test system evaluation device 130 may receive output voltage values from the peak-peak detector circuit 308 and measure a peak-to-peak output voltage of a transmission channel based the output voltage values.

The transmission monitoring signals are individually fed to the RF port of a phase mixer 404 (i.e., a down converting mixer) based on a switching matrix 405. For example, the transmission couplers 305 may be directional couplers (e.g., rat-race couplers, circulators, or the like) configured to direct a fraction of the power of the respective output signal $s_{TX01}(t)$, $s_{TX02}(t)$, and $s_{TX03}(t)$ to the inputs of a switching matrix 405. The switching matrix 405 (i.e., a multiplexer) is configured to receive the transmission monitoring signals from the transmission channels TX01-TX03, and selectively output one of the transmission monitoring signals to the phase mixer 404 for evaluation. As can be seen, the monitoring signal paths coupled between the coupler 305 and the switching matrix 405 may be bidirectional for slave mode testing, as will be described in further detail below.

The RF circuit 100 further includes a monitoring circuit 401. The input of the monitoring circuit 401 is coupled to a test input terminal TEST IN of the MMIC 110, which is coupled to the automated test system microwave source 120. The automated test system microwave source 120 is configured to generated test signals (e.g., RF oscillator signal $s_{TSG}(t)$) having a second fixed frequency that has a large, first frequency offset from the first fixed frequency. For example, the second fixed frequency may be between 4.75 GHz and 5.1 GHz. However, much like the first fixed frequency, the second fixed frequency is not limited to a particular frequency or frequency band.

In addition, the automated test system microwave source 120 is synchronized with the local oscillator 101 such that both devices use a same clock signal CLK for generating their respective signals. For example, the clock signal CLK may be generated by the automated test system microwave source 120 and transmitted on clock signal path 140 to the local oscillator 101, or vice versa. Alternatively, another clock source may generate the clock signal CLK and provide the clock signal to both the automated test system microwave source 120 and the local oscillator 101. As a result, the phases of the test signal $s_{TSG}(t)$ and the RF oscillator signal $s_{LO}(t)$ are synchronized by the clock signal CLK.

The monitoring circuit 401 includes a low pass filter 402 that receives and filters the test signal $s_{TSG}(t)$, which is then passed on to a frequency multiplier 403. The frequency multiplier 403 multiplies the test signal $s_{TSG}(t)$ up to a third fixed frequency that has a second frequency offset from the first fixed frequency, where the second frequency offset is smaller than the first frequency offset. For example, the third fixed frequency may be between 76 GHz-81 GHz. Thus, the frequency multiplier 403 may be a 16× multiplier such that test signal having a frequency between 4.75 GHz and 5.1 GHz is converted up towards the first fixed frequency used by the local oscillator 101. The frequency multiplier 403 generates a multiplied test signal $s_{TSG}'(t)$ having the third fixed frequency at its output.

The monitoring circuit 401 further includes a mixer 404 hereinafter referred to as phase mixer 404 that receives the multiplied test signal $s_{TSG}'(t)$, having phase $\varphi_{TSG}$, and one of the transmission monitoring signals $s_{TX01}'(t)$, $s_{TX02}'(t)$, $s_{TX03}'(t)$, and the multiplied test signal $s_{TSG}'(t)$ is mixed down with the transmission monitoring signal that is selectively coupled from the transmitter subsystem 301.

Since the frequencies of the multiplied test signal $s_{TSG}'(t)$ and the transmission monitoring signals are offset from each other, for example, by the second frequency offset, the mixer output signal $s_{IF}(t)$ will be an intermediate frequency (IF) signal having a frequency equal to the frequency offset (e.g., the second frequency offset). In addition, for each respective transmission channel TX01-TX03, the mixer output signal $S_{IF}(t)$ depends on the cosines of the phase-differences $\varphi_{TSG}-\varphi_{TX01}-\Delta\varphi_{TX01}$, $\varphi_{TSG}-\varphi_{TX02}-\Delta\varphi_{TX02}$, and $\varphi_{TSG}-\varphi_{TX03}-\Delta\varphi_{TX03}$, and the amplitudes $A_{TX01}$, $A_{TX02}$, and $A_{TX03}$, respectively. Said differently, the mixer output signal $S_{IF}(t)$ is an IF signal that represents the phase of the output signal $S_{TXc}(t)$ relative to the phase of the test signal $s_{TSG}(t)$.

Accordingly, measurements may be made by acquiring discrete samples of the mixer output signal $S_{IF}(t)$ at sampling times $t(k,0)$, $t(k,1)$, and $t(k,2)$. The index k denotes the measurement cycle (k=1, 2, 3, . . . ). The measured IF values (sampled values) of the mixer output signal $S_{IF}(t)$ may be used to calculate the sought phase info $\varphi_{TX01}$, $\varphi_{TX02}$, and $\varphi_{TX03}$.

The mixer output signal $s_{IF}(t)$ is output from the phase mixer 404 and is subsequently passed through an IF filter 406 and an IF amplifier 407 to switch 408. The switch 408 is configured to switchably route the mixer output signal $S_{IF}(t)$ to either the automated test system evaluation device 130 for evaluation or to a sensor ADC 409 and a digital signal processor (DSP) 410 for evaluation on the MMIC 110.

The sensor ADC 409 converts the analog mixer output signal $S_{IF}(t)$ into a digital signal $s_{IF}(k)$ having IF sample values. In other words, the sensor ADC 409 is configured to sample the mixer output signal $s_{IF}(t)$ in order to generate a sequence of sample values $S_{IF}(k)$. The sample values depend on the phase difference (i.e., the phase offset $\Delta\varphi_c[k]$) between the signal in the transmission monitoring signal $s_{TXc}'(t)$ and the test signal $s_{TSG}(t)$. Here, only one TX channel is active at a time such that only one transmission monitoring signal is evaluated at a time. The sequence of sample values $S_{IF}(k)$ is provided to the DSP 410, which is configured to apply a fast Fourier transform (FFT) to sequence of sample values $S_{IF}(k)$ in order to obtain a spectrum of those sample values. The DSP 410 may demine phase measurements, phase resolution, phase balance, and phase noise using the spectrum.

The DSP 410 may also be incorporated in a controller that is configured to transmit compensated phase information of a transmission channel to the digital controller 304 in order to control and adjust a phase shift implemented by the phase shifter 302. For example, the DSP 410 may be representative of a control circuit or control unit which may include, for example, a programmable processor such as an (e.g., embedded) microcontroller or a similar device. The functions provided by the control circuit may be (e.g., fully or partly) provided by the system controller 50 (see FIG. 2). Additionally, or alternatively, the functions provided by the control circuit may be at least partly be provided by the DSP 40 (see FIG. 2). As such the control circuit represents a portion of the functions of the system controller 50 and/or the DSP 40.

The automated test system evaluation device 130 may include a sensor ADC and DSP or control unit similar to those described above in reference to ADC 409 and DPS 410, but may offer faster processing power than that of the MMIC 110. Thus, functionality described for sensor ADC 409 and DSP 410 may similarly apply to the automated test system evaluation device 130 and will not be repeated. In some circumstances, the MMIC 110 may not include the ADC 409 and the DPS 410. In this case, the digital conversion, evaluation, and calibration is handled by the automated test system evaluation device 130.

A method of measuring a phase resolution and phase balance of a transmitter signal (i.e., an RF output signal $s_{TX01}(t)$, $s_{TX02}(t)$, and $s_{TX03}(t)$) is described in more detail below.

A test stimuli (test signal $S_{TSG}$) is applied from the ATE 120 with a fixed frequency of about 4.75 GHz to 5.1 GHz which is low pass filtered by low pass filter 402 and then multiplied by 16 by the frequency multiplier 403 integrated on the MMIC 110 to obtain a multiplied test signal $S_{TSG}'$ at output of the multiplier 403. The multiplied test signal $s_{TSG}'$ has a fixed frequency that is offset from the frequency of the oscillator signal $S_{LO}$. The multiplied test signal is then mixed down by the phase mixer 404 (i.e., down conversion mixer) with one of the transmission monitoring signals $S_{TXc}$, which is coupled from the transmitter subsystem 301 and which shares the same frequency of the oscillator signal $S_{LO}$. The transmission monitoring signal $S_{TXc}$ to be evaluated is selected by the switching matrix 405 between different TX channels.

For example, the transmission signal $S_{TX01}$ may be selected for evaluation. In this case, the phase shifter 302 may be configured to apply a first phase setting Φ1 (e.g., a first phase shift) to the transmission signal $s_{TX01}$. The transmission signal $S_{TX01}$ is mixed down with the multiplied test signal $S_{TSG}'$ from the multiplier 403 to generate an intermediated frequency (IF) signal $S_{IF}(t)$ at the output of the down conversion mixer 404. The mixer output (down-conversion) signal $S_{IF}(t)$ can be calculated as follows:

$$s_{IF}(t) \approx A_{TXc} \cdot \cos(\varphi_{TSG} - \Delta\varphi_{TXc} - \varphi_{TXc}). \quad (4)$$

The sensor ADC 409 is configured to convert the analog signal $S_{IF}(t)$ into a digital signal $S_{IF}(k)$, and the DSP 410 is configured to determine the phase ΦIF1 of the digital signal $s_{IF}(k)$ by performing an FFT. For example, a sequence of sampled values of signal $s_{IF}(k)$ depends on the phase difference $\varphi_{TSG} - \varphi_{TX01}$ and the amplitude $A_{TX01}$ of the RF output signal $s_{TX01}(t)$ of channel TX01. Thus, the measured sequence of ADC sample values $s_{IF}(k)$ represent a discrete sinusoidal signal comprising a predetermined number of ADC sample values that follow a sine. The phase of this sinusoidal measurement signal corresponds to the phase ΦIF1, and specifically represents the phase of the output signal $s_{Txc}(t)$ relative to the phase of the test signal $s_{TSG}(t)$.

The DSP 410 applies an FFT to the digital signal $S_{IF}(k)$ to obtain a single-sided spectrum, and uses the single-sided spectrum to extract the phase information ΦIF1 and amplitude information from the carrier. From the amplitude spectrum the maximal amplitude peak and the corresponding frequency bin will be determined. Then the phase for the maximal amplitude will be found out at this same frequency of the corresponding frequency bin. The DSP 410 may further perform an analysis on the spectrum to determine a phase noise of the corresponding transmission channel. For example, for determining the phase noise, the DSP 410 may extract a power of the carrier to obtain a first peak value, extract a power of the offset bin that corresponds to the offset frequency to obtain a second peak value, and calculate a delta between the first peak value and the second peak value to determine the phase noise by also considering the resolution bandwidth.

For example, a DFT algorithm (e.g., a fast Fourier transform (FFT) algorithm) may be applied to the SADC measurement sequence to estimate phase and amplitude (magnitude) values of the TX channel. As a result of the conversion, a plurality of DFT bins with corresponding DFT bin values are generated. Each DFT bin value may include a magnitude value and a phase value. In addition, if the DFT algorithm is an FFT algorithm, a DFT bin may be referred to as an FFT bin and a DFT bin value may be referred to as an FFT bin value. In general, a DFT bin is a harmonic component sample.

In particular, a plurality of Fourier components located at different harmonics, including a first harmonic component located at DFT bin 1, are generated by the DFT. These DFT bins follow a DC DFT bin (i.e., zero is the lowest bin frequency) that has an DFT bin value of zero since there is no DC value of an oscillating pattern. The zeroth bin in the DFT is DC (0 Hz), the first bin is located at Fs/N, where Fs is the sample rate and N is the size of the DFT. The next bin is located at 2*Fs/N, the third bin is located at 3*Fs/N, and so on.

Thus, the sinusoidal SADC measurement sequence $S_{IF}(k)$ provided by the sensor ADC 31 is converted by the DSP 410 using a DFT (e.g., FFT) into frequency components (i.e. a spectrum), also referred to as harmonic components. The maximal peak in amplitude spectrum is located at the FFT bin (offset frequency/(Fs/N)). Therefore, the maximal peak and at which FFT bin the maximal peak is located is determined. Then, the phase at this FFT bin is determined or calculated for the detected signal phase ($\varphi_{TSG} - \Delta\varphi_{TXc} - \varphi_{TXc}$).

Next, the phase shifter 302 is configured to apply a second phase setting Φ2 (i.e., a second phase shift) to the transmission signal $s_{TX01}$, where the second phase setting is different from the first phase setting. The process is repeated to obtain the phase ΦIF2 of the digital signal $S_{IF}(k)$. The phase resolution for transmission channel TX01 may be calculated using the measured phases ΦIF1 and ΦIF2 according to the following equation:

$$TX \text{ phase resolution} = |\Phi 2 - \Phi 1| = |\Phi IF2 - \Phi IF1| \quad (5)$$

This method may then be repeated for the other transmission channels TX02 and TX03, using two different phase settings at the phase shifter 302 to perform two phase measurements and to calculate the phase resolution of the respective transmission channel TXc therefrom. The switching matrix 405 selects which transmission channel is under test.

In addition, by following the above mentioned tests for a second TX channel, the phase balance between two channels may be evaluated. For example, the TX phase balance between channels x and y is calculated as follows:

$$Ph\_Bal\_xy\_set1 = |\Phi IF1,x - \Phi IF1,y| \quad (6)$$

$$Ph\_Bal\_xy\_set2 = |\Phi IF2,x - \Phi IF2,y| \quad (7)$$

Here, ΦIF1,x and ΦIF1,y are the measured phases for transmission channels x and y, respectively, with a first phase setting, and ΦIF2,x and ΦIF2,y are the measured phases for transmission channels x and y, respectively, with a second phase setting. Channels x and y can be any two TX channels of TX subsystem 301. It will be appreciated that while the two phase settings applied by phase shifter 302 are different from each other, one of the applied phase shifts may be zero.

The DSP 410 may then provide the compensated phase information to the digital controller 304, which is configured to adjust a phase setting of a transmission phase shifter 302 of a corresponding transmission channel based on the compensated phase information.

When performing phase balancing, the DSP 410 may test each transmit signal path TX01, TX02, . . . , TXc sequentially. For example, transmit signal path TX01 may be tested based on the described method to determine a phase value of TX01 by activating channel TX01 and deactivating the remaining TX channels. Similarly, transmit signal path TX02 may be tested based on the described method to determine a phase value of TX02 by activating channel TX02 and deactivating the remaining TX channels. Then, the DSP 410 is configured to compare the phase values between the two transmit paths TX01 and TX02, adjust the phase shift of one or more of the phase shifters 302 such that the phase values are balanced/matched or have a desired phase difference. The digital controller 304 then modifies phase shifter values $\Delta\varphi_{TX01}, \Delta\varphi_{TX02}, \ldots, \Delta\varphi_{Txc}$ for the phase shifters 302 according to the adjusted phase settings.

Due to non-ideality of the phase shifter 302, the balanced or desired phase difference could be achieved by repeating the previous procedure several times. Such kind of firmware program could be stored in RAM or ROM on the MMIC chip 110.

The DSP 410 may be further configured to output the phase information and the phase balance information to a digital interface 411 that is configured to output the information from the MMIC 110.

In addition, this arrangement may be used to measure the phase noise of a transmission signal, and thus the phase noise of a TX channel. For example, the DSP 410 may evaluate the digital signal $S_{IF}(k)$ and extract the power of the carrier located at a first FFT bin to obtain a first amplitude peak value, extract the power of an offset FFT bin to obtain a second peak value (e.g., using a bin space of 100 Hz from the first FFT bin, for 10 KHz offset frequency the power at the 10 KHz/100 offset bin compared to the first FFT bin is observed), and then calculate the delta of the first peak value and the second peak value as the phase noise by considering the resolution bandwidth (e.g., 100 Hz).

It follows that if the phase noise of the ATE source (e.g., automated test system microwave source 120) is lower than the local oscillator 101 after accounting for the phase noise degradation of the TEST IN signal $S_{TSG}$ from the ATE after the multiplier block of about 20 log 10(N), where N=multiplying factor of the frequency multiplier 403 (e.g., N=16 in the above example), then the value of the phase noise measured at the IF signal $S_{DC}$ after the down-conversion mixer 404 would be reflective of the phase noise of the local oscillator 101. Thus, the RF circuit 100 makes possible for measuring phase noise at 10 MHz, which is not possible in conventional ATE solutions.

The MMIC 110 can be selectively configured in a master mode or a slave mode to allow use in a cascaded system as a master or a slave. The MMIC 110 may be configured into a slave mode to allow testing of the function of the MMIC in slave mode. During testing of the slave mode, the MMIC 110 may be considered to be in a test mode. In the cascaded setup, multiple radar MMICs 110 are used in a cascaded arrangement. A master MMIC or another slave MMIC provides the local oscillator (LO) signal $S_{LO}$ for a target slave MMIC. For example, the LO signal $S_{LO}(t)$ is passed from an LO output LOout of the master MMIC or other slave MMIC to an LO input LOin of the target slave MMIC. One of the transmitter output ports TX1out-TX3out may be configured as the LO output of the master MMIC or the other slave MMIC. Similarly, one of the transmitter output ports TX1out-TX3out may be configured as the LO input of the target slave MMIC.

When operated in slave mode, the MMIC 110 is configured to receive a slave reference signal $s_{SLO}$ from the another MMIC (i.e., from a master MMIC or from another slave MMIC located upstream in the cascaded arrangement), and local oscillator 101 is disabled. The slave reference signal $s_{SLO}$ is a local oscillator signal generated by another MMIC.

The TX channel corresponding to one of the output ports TX1out-TX3out that is assigned as the LO input is also deactivated. Alternatively, an input port separate from the output port TX1out-TX3out may be connected to an RF buffer (e.g., LO buffer 307) and used to receive the slave reference signal $s_{SLO}$ and all TX channels may remain active.

In this example, the slave reference signal $s_{SLO}$ is received by one of the output ports TX1out-TX3out, being assigned as the LO input, and provided by the assigned port to the coupler 305.

The coupler 305 is configured to route the slave reference signal $s_{SLO}$ to a transmission path 306, which extends from the assigned output port TX1out-TX3out (i.e., the assigned LO input) via an LO buffer 307 to the shared transmission channel of the RF signal distribution circuit 201. Specifically, the transmission path 306 is configured to receive the slave reference signal $s_{SLO}$ from the LO input port and inject a transmit signal $s_{SLO}'$ that is based on the slave reference signal $s_{SLO}$ into the input of the signal distributor 203 at TX IN. Thus, TX IN is an injection point that is coupled to the TX channels via the signal distributor 203.

The signal distributor 203 is configured to route the transmit signal $S_{SLO}'$ to one of the transmission channels TX01-TX03, as was similarly done for the RF oscillator signal $s_{LO}(t)$. As a result, a transmission channel may output a transmit signal within an operating frequency range (e.g., 76 GHz-81 GHz) based on the transmit signal $s_{SLO}'$, which is based on the slave reference signal $s_{SLO}$.

The power of a signal transmitted through the transmission path 306 and a selected transmission channel can be measured using the peak-peak detector circuit 308. The MMIC 110 may be configured into a test mode to test the power of a signal transmitted through the transmission path 306 and a selected transmission channel.

The test is performed using the automated test system evaluation device 130 in order to measure the transmission performance of the slave mode. For example, since for the slave mode the LO buffer 307 is required to receive the LO reference signal, the test described herein allows testing this component which otherwise might not be tested. In test mode, the down-conversion mixer 404 and the blocks downstream therefrom may be disabled. Instead, an RF buffer 412 is enabled. The RF buffer 412 is configured to receive the multiplied test signal $s_{TSG}'$ from the frequency multiplier 403. As one may recall, the multiplied test signal $s_{TSG}'$ has a fixed frequency that may be between 76 GHz-81 GHz. This is also the operating frequency range of the slave reference signal $s_{SLO}$.

The multiplied test signal $S_{TSG}'$ is passed through the RF buffer 412 and is routed to the switching matrix 405 and ultimately to the directional coupler 305. In particular, the multiplied test signal $s_{TSG}'$ is routed by the switching matrix 405 to the directional coupler 305, and further routed by the direction coupler 305 to the transmission path 306, which includes LO buffer 307. The multiplied test signal $S_{TSG}'$ passes through the LO buffer 307 as multiplied test signal $S_{TSG}"$ and is provided by the transmission path 306 to the transmission input TX IN (i.e., the injection point), which is the input to the signal distributor 203. The LO signal distributor 203 then distributes the multiplied test signal $s_{TSG}"$, as a test LO signal, to one or more of the active transmission channels under test. The transmission channel selected to receive the multiplied test signal $S_{TSG}"$ outputs a test transmit signal based on the multiplied test signal $S_{TSG}"$.

For testing the slave mode (in test mode), each transmission channel TX01-TX03 include a peak-peak detector circuit 308 configured to receive a test transmit signal generated from the multiplied test signal $s_{TSG}"$, and measure a transmission output power of its transmission channel based on the respective test transmit signal. The automated test system evaluation device 130 may receive output voltage values from the peak-peak detector circuit 308 and measure a peak-to-peak output voltage of a transmission channel based the output voltage values. By doing so, the automated test system evaluation device 130 may test the power of a signal that is transmitted through the transmission path 306 and a selected transmission channel. A malfunction for example of the LO buffer 307 or the transmission path 306 can be detected by the above described slave mode testing which is not possible in conventional systems.

With this multiplied test signal $S_{TSG}'$ as a 76-81 GHz input signal, the measuring of the transmission performance is possible to be measured since the signal is generated on chip and the limitation due to the ATE is overcome.

In view of the above, the RF circuit 100 is configured to perform TX phase and phase resolution measurements faster than conventional ATE systems. This test time reduction results in lower overall production costs. In addition, with the proposed phase noise measurement technique, a lower cost instrument could be used (e.g., a digital capture instrument), leading to higher test parallelism (i.e., lower Test cost and wafer touchdown). The proposed phase noise measurement technique also provides increased test stability for 1 MHz offset phase noise measurements and higher test coverage may be achieved for testing 10 MHz offset phase noise measurements. Lastly, functional tests for slave mode operation may be performed in production testing without using an external mm-wave source, leading to increased test coverage.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor" or "processing circuitry" as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A radio frequency (RF) system, comprising:
   a radar monolithic microwave integrated circuit (MMIC), comprising:
   a first transmission channel configured to generate a first continuous-wave transmit signal based on a local oscillator signal having a first frequency;
   a first phase shifter provided on the first transmission channel and configured to apply a first phase setting to the first continuous-wave transmit signal to generate a first transmit signal having the first frequency, wherein the first transmission channel provides the first transmit signal to a transmission antenna port;
   a first transmit monitoring signal path configured to couple out a portion of the first transmit signal from the first transmission channel as a first transmit monitoring signal;
   a test input port configured to receive a test signal from a source external to the radar MMIC;

a frequency multiplier configured to receive the test signal and convert the test signal into a multiplied test signal having a second frequency, wherein the first and the second frequencies are separated by a frequency offset; and a down-conversion mixer configured to mix the multiplied test signal and the first transmit monitoring signal to generate a first mixer output signal.

2. The RF system of claim 1, further comprising:
an analog-to-digital converter (ADC) configured to sample the first mixer output signal in order to provide a first sequence of sample values; and
at least one processor configured to apply a fast Fourier transform (FFT) to the first sequence of sample values to generate a first spectrum and determine a first phase of the first mixer output signal using the first spectrum.

3. The RF system of claim 2, wherein the ADC and the at least one processor are integrated on the radar MMIC.

4. The RF system of claim 2, further comprising:
an automated test system coupled to the radar MMIC, wherein the automated test system comprises the ADC and the at least one processor,
wherein the MMIC comprises a test output port configured to output the first mixer output signal to the automated test system.

5. The RF system of claim 2, wherein the at least one processor is configured to perform an analysis on the first spectrum to determine a phase noise of the first transmission channel.

6. The RF system of claim 2, wherein:
the first phase shifter is configured to apply a second phase setting, different from the first phase setting, to the first continuous-wave transmit signal to generate a second transmit signal having the first frequency,
the first transmit monitoring signal path is configured to couple out a portion of the second transmit signal from the first transmission channel as a second transmit monitoring signal,
the down-conversion mixer is configured to mix the multiplied test signal and the second transmit monitoring signal to generate a second mixer output signal,
the ADC is configured to sample the second mixer output signal in order to provide a second sequence of sample values, and
the at least one processor is configured to apply the FFT to the second sequence of sample values to generate a second spectrum, determine a second phase of the second mixer output signal using the second spectrum, and calculate a transmission phase resolution of the first transmission channel based on a difference between the first phase and the second phase.

7. The RF system of claim 2, wherein the radar MMIC further comprises:
a second transmission channel configured to output a second continuous-wave transmit signal based on the local oscillator signal;
a second phase shifter provided on the second transmission channel and configured to apply the first phase setting to the second continuous-wave transmit signal to generate a second transmit signal having the first frequency; and
a second transmit monitoring signal path configured to couple out a portion of the second transmit signal from the second transmission channel as a second transmit monitoring signal,
wherein:
the down-conversion mixer is configured to mix the multiplied test signal and the second transmit monitoring signal to generate a second mixer output signal,
the ADC is configured to sample the second mixer output signal in order to provide a second sequence of sample values, and
the at least one processor is configured to apply the FFT to the second sequence of sample values to generate a second spectrum, determine a first phase of the second mixer output signal using the second spectrum, and calculate a phase balance between the first transmission channel and the second transmission channel based on a difference between the first phase of the first mixer output signal and the first phase of the second mixer output signal.

8. The RF system of claim 1, wherein:
the local oscillator signal is a continuous wave signal having the first frequency that is fixed, and
the test signal is a continuous wave signal having a third frequency that is fixed.

9. The RF system of claim 1, further comprising:
wherein the radar MMIC further comprises a local oscillator configured to generate the local oscillator signal based on a clock signal and provide the local oscillator signal to the first transmission channel,
wherein the test signal and the clock signal are synchronized.

10. A method of measuring transmission phase information, comprising:
generating a first continuous-wave transmit signal based on a local oscillator signal having a first frequency, the first continuous-wave transmit signal being transmitted on a first transmission channel;
applying a first phase setting to the first continuous-wave transmit signal to generate a first transmit signal;
coupling out a portion of the first transmit signal from the first transmission channel as a first transmit monitoring signal;
receiving a test signal from an external source;
frequency multiplying the test signal into a multiplied test signal having a second frequency, wherein the first and the second frequencies are separated by a frequency offset; and
mixing the multiplied test signal and the first transmit monitoring signal to generate a first mixer output signal.

11. The method of claim 10, further comprising:
digitally sampling the first mixer output signal in order to provide a first sequence of sample values;
applying a fast Fourier transform (FFT) to the first sequence of sample values to generate a first spectrum;
determining a first phase of the first mixer output signal using the first spectrum.

12. The method of claim 11, further comprising:
analyzing the first spectrum to determine a phase noise of the first transmission channel.

13. The method of claim 11, further comprising:
applying a second phase setting, different from the first phase setting, to the first continuous-wave transmit signal to generate a second transmit signal having the first frequency;
coupling out a portion of the second transmit signal from the first transmission channel as a second transmit monitoring signal;
mixing the multiplied test signal and the second transmit monitoring signal to generate a second mixer output signal;

digitally sampling the second mixer output signal in order to provide a second sequence of sample values;
applying the FFT to the second sequence of sample values to generate a second spectrum;
determining a second phase of the second mixer output signal; and
calculating a transmission phase resolution of the first transmission channel based on a difference between the first phase and the second phase.

14. The method of claim 11, further comprising:
generating a second continuous-wave transmit signal based on the local oscillator signal, the second continuous-wave transmit signal being transmitted on a second transmission channel;
applying the first phase setting to the second continuous-wave transmit signal to generate a second transmit signal having the first frequency;
coupling out a portion of the second transmit signal from the second transmission channel as a second transmit monitoring signal;
mixing the multiplied test signal and the second transmit monitoring signal to generate a second mixer output signal comprising a second plurality of values;
digitally sampling the second mixer output signal in order to provide a second sequence of sample values;
applying the FFT to the second sequence of sample values to generate a second spectrum;
determining a first phase of the second mixer output signal using the second spectrum; and
calculating a phase balance between the first transmission channel and the second transmission channel based on a difference between the first phase of the first mixer output signal and the first phase of the second mixer output signal.

15. The method of claim 10, further comprising:
generating a clock signal;
generating the test signal using the clock signal;
generating the local oscillator signal using the clock signal such that the test signal and the local oscillator signal are synchronized to the clock signal.

16. A radar monolithic microwave integrated circuit (MMIC) configurable into a plurality of modes, including a slave mode and a test mode, comprising:
an input port configured to receive a slave reference signal from a local oscillator of another radar MMIC;
a first transmission channel configurable in a slave mode to output a first transmit signal within an operating frequency range based on the slave reference signal;
a transmission path having an injection point coupled to a plurality of transmit channels, including the first transmission channel, the injection point receiving a second transmit signal that is based on the slave reference signal, wherein the transmission path extends from the input port to the injection point;
a test input port configured to receive a test signal from a source external to the radar MMIC;
a frequency multiplier configured to receive the test signal and convert the test signal into a multiplied test signal; and
a coupler configured to receive the multiplied test signal and couple the multiplied test signal into the transmission path.

17. The radar MMIC of claim 16, further comprising:
a local oscillator buffer provided on the transmission path, wherein the local oscillator buffer is configured to receive the multiplied test signal from the coupler and transmit the multiplied test signal to the injection point.

18. The radar MMIC of claim 16, further comprising:
a signal distributor coupled to the plurality of transmit channels and comprising an input coupled to the injection point,
wherein, on a condition that the radar MMIC is configured into the slave mode, the signal distributor is configured to receive the second transmit signal from the transmission path and route the second transmit signal to the first transmission channel, wherein the first transmission channel outputs the first transmit signal based on the second transmit signal.

19. The radar MMIC of claim 16, further comprising:
a signal distributor coupled to the plurality of transmit channels and comprising an input coupled to the injection point,
wherein, on a condition that the radar MMIC is configured into the test mode, the signal distributor is configured to receive the multiplied test signal from the transmission path and route the multiplied test signal to the first transmission channel, wherein the first transmission channel outputs a third transmit signal based on the multiplied test signal.

20. The radar MMIC of claim 19, further comprising:
a peak-peak detector circuit coupled to the first transmission channel, the peak-peak detector circuit configured to receive a portion of the third transmit signal and measure a transmission output power of the first transmission channel during the test mode based on the received portion of the third transmit signal.

21. The radar MMIC of claim 16, further comprising:
a test signal path that extends at least from the frequency multiplier to the coupler on which the multiplied test signal propagates; and
a radio frequency (RF) buffer provided on the test signal path between the frequency multiplier and the coupler.

* * * * *